(12) United States Patent  
Kapur et al.

(10) Patent No.: US 7,669,098 B2  
(45) Date of Patent: Feb. 23, 2010

(54) METHOD AND APPARATUS FOR LIMITING POWER DISSIPATION IN TEST

(75) Inventors: Rohit Kapur, Cupertino, CA (US); Thomas W. Williams, Boulder, CO (US)

(73) Assignee: Synopsys, Inc., Mountain View, CA (US)

( * ) Notice: Subject to any disclaimer, the term of this patent is extended or adjusted under 35 U.S.C. 154(b) by 497 days.

(21) Appl. No.: 11/635,155

(22) Filed: Dec. 7, 2006

(65) Prior Publication Data

US 2008/0141188 A1 Jun. 12, 2008

(51) Int. Cl.
*G01R 31/28* (2006.01)
(52) U.S. Cl. ...................................... 714/726
(58) Field of Classification Search .................. 714/726
See application file for complete search history.

(56) References Cited

U.S. PATENT DOCUMENTS

| | | | |
|---|---|---|---|
| 5,907,562 A * | 5/1999 | Wrape et al. ................ 714/726 |
| 7,051,255 B2 * | 5/2006 | Gschwind ................... 714/726 |
| 7,219,280 B2 * | 5/2007 | McNall ...................... 714/726 |
| 7,392,447 B2 * | 6/2008 | Tang et al. .................. 714/726 |
| 7,487,417 B2 * | 2/2009 | Branch et al. ............... 714/726 |
| 2006/0107144 A1 * | 5/2006 | Saxena et al. ............... 714/726 |
| 2007/0061647 A1 * | 3/2007 | Dhong et al. ............... 714/726 |

* cited by examiner

*Primary Examiner*—James C Kerveros
(74) *Attorney, Agent, or Firm*—Park, Vaughan & Fleming LLP (57) ABSTRACT

An embodiment provides a system for testing a circuit. During operation, the system scans-in input values into a first set of flip-flops. The outputs of the first set of flip-flops are coupled with the inputs of a circuit under test, the outputs of the circuit are coupled with the inputs of a set of multiplexers, and the outputs of the set of multiplexers are coupled with the inputs of a second set of flip-flops. Next, the system configures the set of multiplexers using a segment-selection circuit, which causes the outputs of the circuit to be coupled with the inputs of the second set of flip-flops. The system then captures the circuit's output values using the second set of flip-flops. Next, the system scans-out the circuit's output values using the second set of flip-flops. Finally, the system determines whether the chip has a fault using the output values.

20 Claims, 6 Drawing Sheets

METHOD AND APPARATUS FOR LIMITING POWER DISSIPATION IN TEST

FIELD OF THE INVENTION

The present invention relates to semiconductor design and manufacturing. More specifically, the present invention relates to a method and an apparatus for limiting power dissipation in test.

BACKGROUND

Related Art

Dramatic improvements in semiconductor manufacturing technologies have made it possible to integrate tens of millions of devices onto a single IC (integrated circuit). At the same time, the insatiable demand for handheld devices has created a strong push to develop complex, high-performance ICs that consume very little power.

These developments have given rise to new challenges in the design and manufacture of semiconductor chips. Specifically, chip testing has become one of the most challenging aspects of circuit design.

Traditionally, chip-testing techniques were intended to optimize area overhead, fault coverage, test application time, test development effort, etc. However, due to the recent push towards low-power systems, reducing power dissipation during test has become an important issue.

A circuit-under-test (CUT) can be viewed as a combinational and/or a sequential logic with inputs and outputs. A CUT can be tested by first applying inputs to the CUT and capturing its outputs. A fault in the CUT can then be identified by comparing the CUT's actual outputs with a "good" chip's outputs.

A common technique for testing chips involves using flip-flops within a chip to apply inputs to the CUT and to capture outputs of the CUT. Usually, test inputs are scanned into a set of flip-flops which are coupled with the CUT's inputs. Next, the chip is clocked and the CUT's output values are captured in a second set of flip-flops, which can then be scanned out. Finally, the output values can be used to determine whether the CUT has a fault.

Unfortunately, in low-power designs, power dissipation during scan-in, capture, and scan-out has become a serious problem. Specifically, the power dissipation during test can be substantially greater than the power dissipation during normal operation.

Present low-power circuit design techniques use clock gating to switch off certain parts of a circuit during normal operation. Today's low-power circuits can contain a large number of functions and/or modules which are not all used at the same time. Hence, when a particular function or module is not being used it can be switched off using clock gating to save power. A control logic is typically used to determine when to switch off and when to switch on the clock. Note that designing such a control logic requires detailed knowledge of the circuit's functionality.

Unfortunately, a circuit cannot be scanned if its clock is switched off. Hence, during test, clock gating mechanisms are usually bypassed which can cause the power dissipation during test to increase substantially. Typically, input values are scanned-in and output values are scanned-out using a path which circumvents clock gating. Furthermore, clock gating is also typically disabled during capture so that the output values of the CUT can be observed in flip-flops.

A substantial increase in power dissipation can result in disastrous consequences. For example, an increase in the average power dissipation can cause overheating, which can cause the chip to burnout. Likewise, an increase in the peak power can cause a burnout or a substantial "IR drop" which can corrupt the data in the circuit, thereby invalidating the test.

Prior art techniques that reduce power dissipation during test have a number of drawbacks. Some prior art techniques attempt to reduce power dissipation by manipulating the test patterns. For example, a technique called adjacent-fill determines input values in the test pattern so that the amount of flip-flop toggling is minimized when the input values are scanned into the flip-flops. However, this technique only reduces the power dissipation during scan-in.

Other prior art techniques manipulate the scan-chain logic. For example, one technique gates the outputs of the flip-flops so that the CUT's output values don't cause unnecessary toggling of downstream flip-flops during scan. However, this technique usually results in substantial area overhead and it only helps to reduce power dissipation during scan.

Yet another technique uses clock gating to turn off certain parts of the scan-chain during test. However, to be effective, this technique can require clock gating to be used at a substantially large number of locations, which can increase the complexity and area overhead of the chip. Further, since this technique changes the functional logic of the chip, it may not to be preferred by chip designers because it may create more problems (e.g., timing problems) than it solves.

Additionally, although prior art techniques may reduce power dissipation, they do not guarantee that the power dissipation will be within a specified power budget. Hence, even after we use prior art techniques to reduce power dissipation, the chip may still burnout during test.

Hence, what is needed is a method and apparatus for testing a chip without the above-described drawbacks.

SUMMARY

One embodiment of the present invention provides a structured methodology to guarantee that the power dissipation during test is within a specified power budget.

When a flip-flop changes state (i.e., changes value) it dissipates power. The present invention provides techniques and systems which can ensure that only a limited number of flip-flops change state during test, thereby guaranteeing that the power dissipation is within a power budget.

An embodiment of the present invention scans-in input values using an adjacent-fill technique which substantially reduces the number of flip-flop transitions during the scan-in phase.

The embodiment can comprise a segment-selection circuit whose outputs are coupled with the control inputs of a set of multiplexers. The set of multiplexers can be used to determine whether the flip-flops capture the output values of the CUT or the previous shift values. Note that a flip-flop may change state during capture. By appropriately configuring the set of multiplexers using the segment-selection circuit, the embodiment can ensure that only a limited number of flip-flops change state during capture.

After the capture phase, the embodiment can scan-out the captured values. The power dissipation during scan-out may be substantially reduced because (a) the embodiment uses adjacent-fill to determine the flip-flop values during scan-in, and (b) the embodiment ensures that only a limited number of flip-flops change state during the capture phase.

In this manner, the embodiment can guarantee that the power dissipation during each phase of the test is within a power budget, thereby guaranteeing that the power dissipation is within the power budget during the test without gating the clock.

DETAILED DESCRIPTION

Integrated Circuit Design Flow

Figure 1:
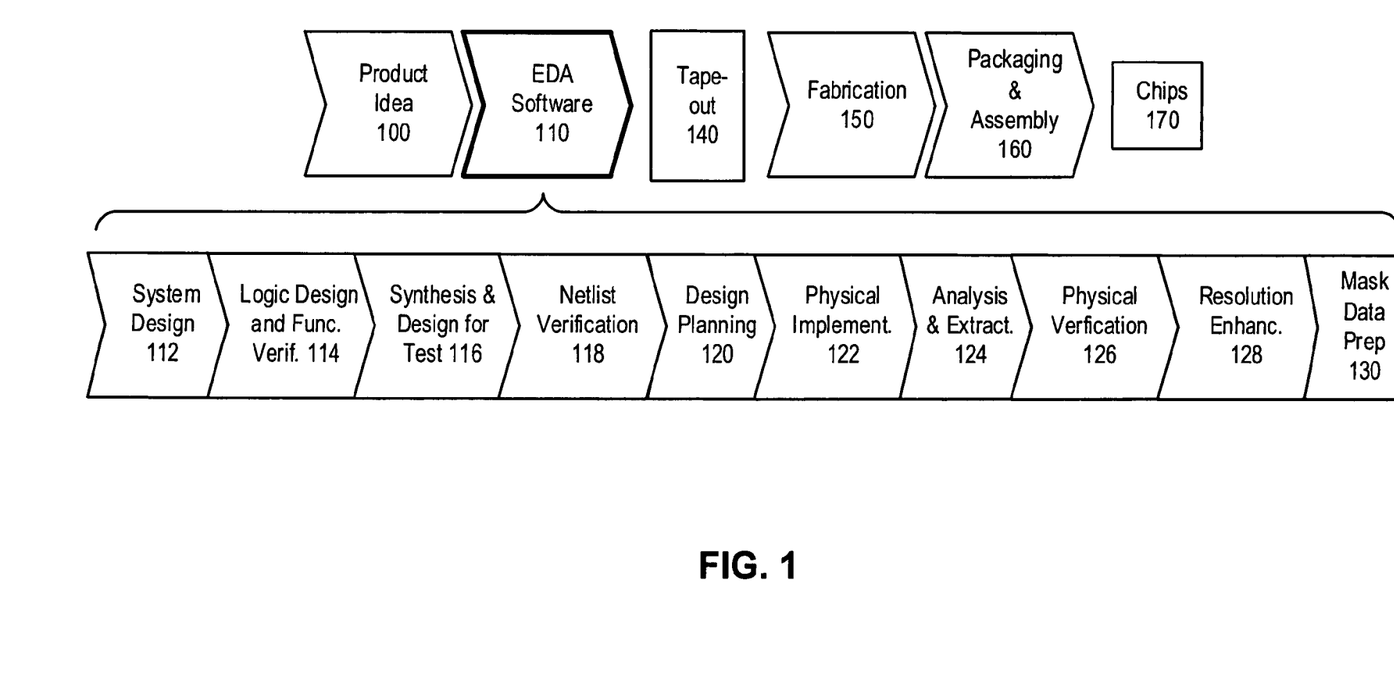
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process typically starts with the product idea (step 100) which can be realized using an EDA design process (step 110). When the design is finalized, it can be taped-out (event 140). After tape out, the fabrication process (step 150) and packaging and assembly processes (step 160) are performed which ultimately result in finished chips (result 170).

The EDA design process (step 110), in turn, comprises steps 112-130, which are described below. The following design flow description is for illustration purposes only. This description is not meant to limit the present invention. For example, an actual integrated circuit design may require the designer to perform the design steps in a different sequence than the sequence described below.

System design (step 112): In this step, the designers describe the functionality that they want to implement. They can also perform what-if planning to refine functionality, check costs, etc. Hardware-software architecture partitioning can occur at this stage. Exemplary EDA products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA products from Synopsys, Inc. that can be used at this step include Design Compiler®, Physical Compiler, Test Compiler, Power Compiler, FPGA Compiler, TetraMAX, and DesignWare® products.

Netlist verification (step 118): At this step, the netlist is checked for compliance with timing constraints and for correspondence with the VHDL/Verilog source code. Exemplary EDA products from Synopsys, Inc. that can be used at this step include Formality, PrimeTime, and VCS products.

Design planning (step 120): Here, an overall floorplan for the chip is constructed and analyzed for timing and top-level routing. Exemplary EDA products from Synopsys, Inc. that can be used at this step include Astro and IC Compiler products.

Physical implementation (step 122): Placement and routing occurs at this step. Exemplary EDA products from Synopsys, Inc. that can be used at this step include the Astro and IC Compiler products.

Analysis and extraction (step 124): At this step, the circuit function is verified at a transistor level, which also permits what-if refinement. Exemplary EDA products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA products from Synopsys, Inc. that can be used at this step include the Hercules product.

Resolution enhancement (step 128): This step involves geometric manipulations of the layout to improve manufacturability of the design. Exemplary EDA products from Synopsys, Inc. that can be used at this step include Proteus, ProteusAF, and PSMGen products.

Mask data preparation (step 130): This step provides the "tape-out" data for production of masks to produce finished chips. Exemplary EDA products from Synopsys, Inc. that can be used at this step include the CATS(R) family of products.

Embodiments of the present invention can be used during, before, or after one or more of the above-described steps. For example, one embodiment of the present invention can be used during the synthesis and design for test step 116.

Circuit Testing

One approach for testing chips involves using flip-flops within the chip to apply inputs to a CUT and to capture the outputs of the CUT. Note that, in general, a flip-flop can be any circuit that can store a single bit of information. The flip-flops can be coupled to form a scan-chain. During scan-in and scan-out, the output of a flip-flop in a scan-chain is coupled with the input of the next flip-flop which enables the system to serially scan-in or scan-out values into or out of the flip-flops.

The outputs of a first set of flip-flops can be coupled with the inputs of a CUT. The outputs of the CUT, in turn, can be coupled with the inputs of a set of multiplexers. Finally, the outputs of the set of multiplexers can be coupled with the inputs of a second set of flip-flops. Note that the first set of flip-flops can be used to apply the input values to the CUT, whereas the second set of flip-flops can be used to capture output values of the CUT.

When a flip-flop changes state (i.e., changes value) it dissipates power. Hence, if adjacent flip-flops in a scan-chain have the same value, it can reduce power dissipation during scan-in. A technique called adjacent-fill uses this insight to determine the input values so that the power dissipation during scan-in is substantially reduced.

However, prior art techniques do not adequately handle the power dissipation problem during capture and scan-out. One embodiment of the present invention solves both of these problems. Specifically, the embodiment limits the number of flip-flops that can change state during capture. Further, the embodiment extends the benefits of adjacent-fill to scan-out, i.e., it uses the input values determined using adjacent-fill to substantially reduce the number of flip-flops that change state during scan-out.

Process for Testing a Circuit

Figure 3:
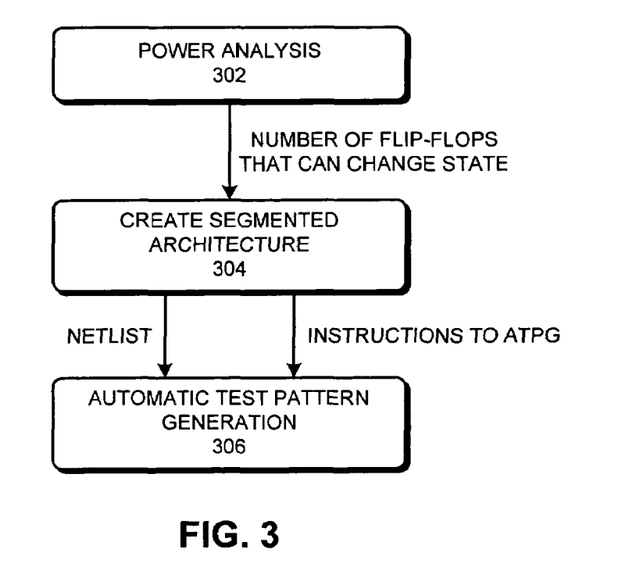
FIG. 3 presents a flowchart that illustrates how a power budget can be used to determine capture segments and test patterns in accordance with an embodiment of the present invention.

FIG. 3 presents a flowchart that illustrates how a power budget can be used to determine capture segments and test patterns in accordance with an embodiment of the present invention.

The system can first determine a power budget by performing a power analysis of the chip (step 302). Note that the power budget can specify the number of flip-flops that can change state during test.

Next, the system can create a segmented architecture which can enable the system to guarantee that the power budget is not violated during test (step 304). Note that a segmented architecture can be an architecture that includes a segment-selection circuit which can be used to configure a set of multiplexers to "select" a set of flip-flops.

Finally, the input values, the first set of flip-flops (which are used for applying the input values to the CUT), and the second set of flip-flops (which are used for capturing the output values of the CUT) can be determined using automatic test pattern generation (step 306).

Note that automatic test pattern generation (ATPG) can receive a "netlist" which describes the segmented architecture and a set of test-generating instructions which may be created using the power budget. Additionally, ATPG can use adjacent-fill to determine the input values.

Figure 2:
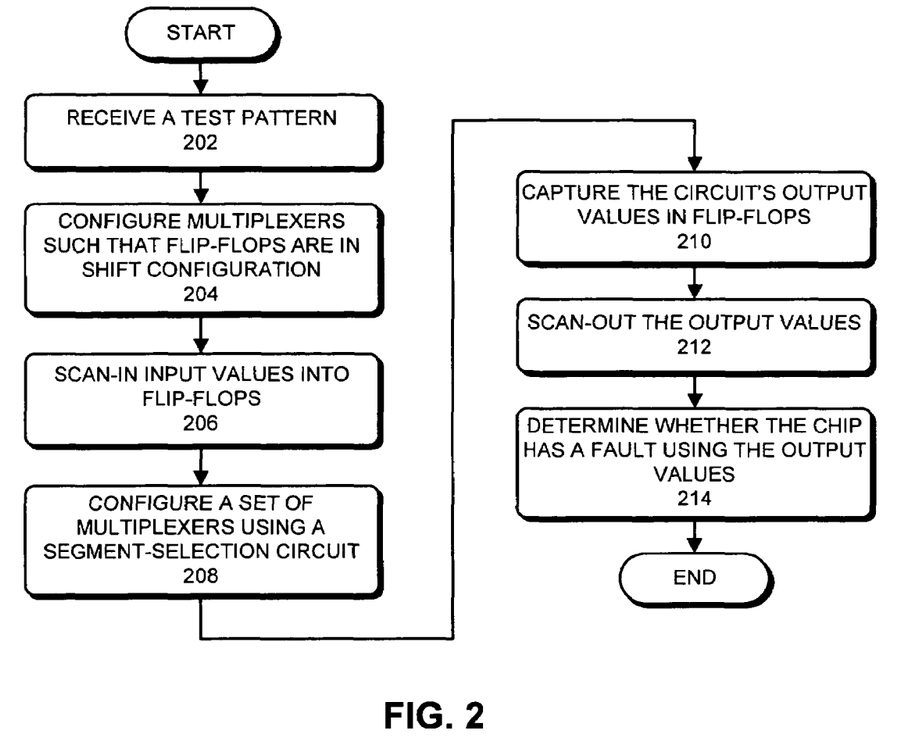
FIG. 2 presents a flowchart that illustrates a process of applying a test to a circuit in accordance with an embodiment of the present invention.

FIG. 2 presents a flowchart that illustrates a process of applying a test to a circuit in accordance with an embodiment of the present invention.

The process can begin by receiving a test pattern (step 202). The test pattern can be generated using ATPG, e.g., as described in step 306 above.

The system can then use the segment-selection circuit to configure the multiplexers such that flip-flops are in shift configuration, thereby causing segments to receive data from the previous shift position (step 204).

Next, the system can scan-in the input values into a first set of flip-flops (step 206). In one embodiment, the first set of flip-flops can include all flip-flops that are used for test. Note that, when multiple tests are applied to the CUT, the scan-out operation of the previous test (step 212) can be concurrently performed with the scan-in operation for the current test.

Figure 4:
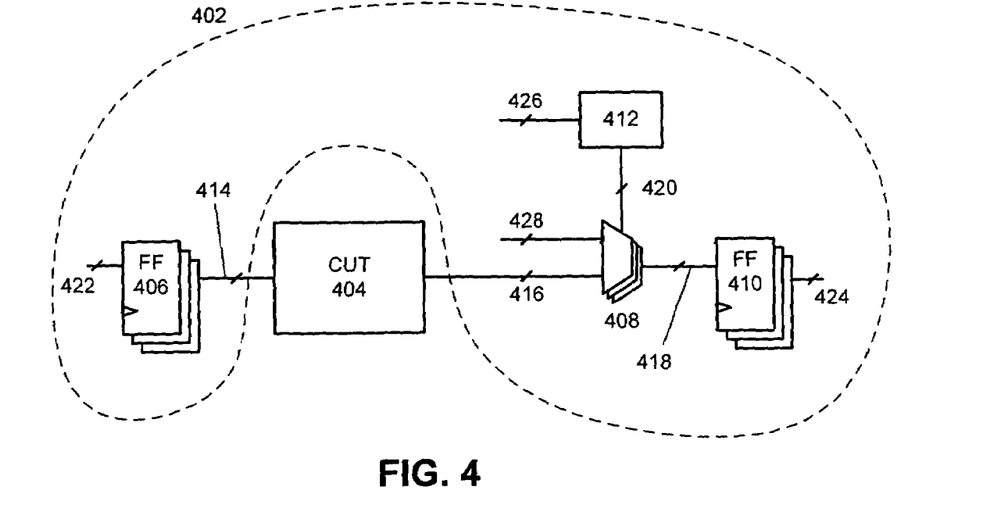
FIG. 4 illustrates a circuit which can be used to test another circuit in accordance with an embodiment of the present invention.

FIG. 4 illustrates a circuit which can be used to test another circuit in accordance with an embodiment of the present invention.

Circuit 402 can be used to test CUT 404. Circuit 402 can include a first set of flip-flops 406, a set of multiplexers 408, a second set of flip-flops 410, and a segment-selection circuit 412.

The outputs 414 of the first set of flip-flops 406 can be coupled with the inputs of CUT 404. The outputs of CUT 404, in turn, can be coupled with the inputs 416 of the set of multiplexers 408. Further, the outputs of the set of multiplexers 408 can be coupled with the inputs 418 of the second set of flip-flops 410. The outputs of the segment-selection circuit 412 can be coupled with the control inputs 420 of the set of multiplexers 408. The segment-selection circuit 412 can be used to couple an output of CUT 404 with an input of a flip-flop in the second set of flip-flops 410. Note that the segment-selection circuit 412 can be used to guarantee that the power dissipation of the chip does not exceed a specified power budget during capture.

Inputs 422 of the first set of flip-flops 406 can be coupled with the outputs of multiplexers (not shown), whose inputs can be coupled with the outputs of flip-flops (also not shown) to form one or more scan-chains. Similarly, outputs 424 of the second set of flip-flops 410 can be coupled with the inputs of multiplexers (not shown), whose outputs can be coupled with the inputs of flip-flops (also not shown) to form one or more scan-chains.

Inputs 428 of the set of multiplexers 408 can be coupled with the outputs of flip-flops (not shown) which are part of a scan-chain. Specifically, the inputs 428 can be selected (i.e., coupled with the multiplexers' outputs) during scan-in and scan-out.

Inputs 426 can be used to control the segment-selection circuit 412. Note that the segment-selection circuit 412's inputs 426 do not require separate pins on the chip. For example, inputs 426 can be coupled with the outputs of flip-flops (not shown). In this manner, the segment-selection circuit can be controlled using flip-flops whose values can be set during a scan-in operation.

As mentioned before, a scan-chain is a sequence of flip-flops. The output of a flip-flop in a scan-chain is coupled with the input of the next flip-flop in the scan-chain. During scan-in or scan-out, at each clock period, the value stored in a flip-flop moves to the next flip-flop in the scan-chain. In this manner, a system can serially scan-in (or scan-out) values into (or out of) the flip-flops. A scan-chain may be terminated using a pin on the chip.

In one embodiment, a segment-selection circuit can be realized using a decoder. Specifically, the decoder can take a code as a segment identifier and set the line that enables the associated segment. The segment-selection circuit (e.g., a decoder based circuit) can support two additional configurations, namely, selecting all segments in the shift configuration, and selecting all segments in the capture configuration where the CUT response is captured. The first of these additional configurations is used for applying the scan operations (scan-in and scan-out) and the second of the additional configurations is maintained for the design to operate functionally with the original intent. The second configuration would typically not be used by the test patterns.

For example, the segment-selection circuit can be realized for six capture segments as follows. Note that the total number of configurations to be supported by the segment selection circuit would be eight (because of the additional two configurations described above). These eight configurations can be encoded using three bits which can be applied to the segment-selection control inputs 426. The following table defines the logic of the above-described segment-selection circuit.

| Code-bits | Output 1 | Output 2 | Output 3 | Output 4 | Output 5 | Output 6 |
|---|---|---|---|---|---|---|
| 000 | 1 | 0 | 0 | 0 | 0 | 0 |
| 001 | 0 | 1 | 0 | 0 | 0 | 0 |
| 010 | 0 | 0 | 1 | 0 | 0 | 0 |
| 011 | 0 | 0 | 0 | 1 | 0 | 0 |
| 100 | 0 | 0 | 0 | 0 | 1 | 0 |
| 101 | 0 | 0 | 0 | 0 | 0 | 1 |
| 110 | 1 | 1 | 1 | 1 | 1 | 1 |
| 111 | 0 | 0 | 0 | 0 | 0 | 0 |

In the above table, the code-bits represent the inputs to the segment selection circuit, e.g., inputs 426. Further, output 1, output 2, etc. represent the outputs of the segment selection circuit which are coupled with the control inputs of the multiplexers, e.g., control inputs 420. An output value of "0," can put the associated multiplexer in the scan configuration and an output value of "1" can put the associated multiplexer in the capture configuration. Hence, when code "000" is applied to the segment-selection circuit, the first capture segment that is controlled by output 1 captures the response to the CUT and the remaining segments capture the value from the previous shift position. In this example the scan operation of the test is performed with code 111 and the capture operation is performed by any of the codes from 000 to 101 as determined by the test generation technique.

Figure 5:
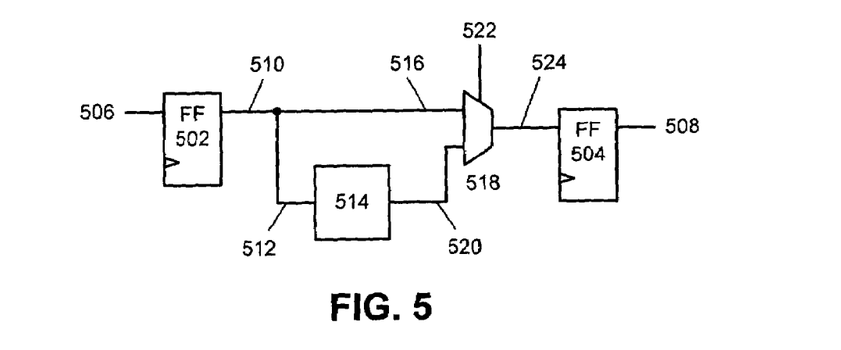
FIG. 5 illustrates a portion of a scan-chain in accordance with an embodiment of the present invention.

FIG. 5 illustrates a portion of a scan-chain in accordance with an embodiment of the present invention.

Flip-flops 502 and 504 can be adjacent flip-flops in a scan-chain. Flip-flop 502's input 506 may be coupled with the output of another flip-flop (not shown) which is located before flip-flop 502 in the scan-chain. Similarly, flip-flop 504's output 508 may be coupled with the input of another flip-flop (not shown) which is located after flip-flop 504 in the scan-chain. Flip-flop 502's output 510 may be coupled with the input 512 of circuit 514, which may be a circuit which is being test. Flip-flop 502's output 510 may also be coupled with input 516 of multiplexer 518. Further, circuit 514's output may be coupled with input 520 of multiplexer 518. Multiplexer 518 may be controlled using control input 522. Output of multiplexer 518 may be coupled with input 524 of flip-flop 504.

During scan-in and scan-out, control input 522 can be used to couple flip-flop 502's output 510 with flip-flop 504's input 524. On the other hand, during capture, control input 522 can be used to couple circuit 514's output 520 with flip-flop 504's input 524.

Specifically, first set of flip-flops 406 and the second set of flip-flops 410 can include flip-flops that are in one or more scan-chains. Specifically, the first set of flip-flops 406 and second set of flip-flops 410 can include contiguous or non-contiguous flip-flops that are in the same or different scan-chains.

Continuing with the flowchart in FIG. 2, the system can then configure the set of multiplexers using a segment-selection circuit, which causes the outputs of the CUT to be coupled with the inputs of the second set of flip-flops (step 208).

Specifically, segment-selection circuit 412 can be used to configure set of multiplexers 408 so that the outputs of CUT 404 are coupled with the inputs 418 of the second set of flip-flops 410.

A segment is a set of flip-flops which can belong to different scan-chains. Specifically, a segment can comprise the second set of flip-flops 410. The segment-selection circuit 412 can "select" the segment comprising the second set of flip-flops 410 by configuring the set of multiplexers 408 using control inputs 420. The "selected" segment can then be used to capture the outputs of CUT 404.

Conversely, flip-flops that are not in the selected segment do not capture the CUT's outputs. These flip-flops can be configured to minimize the power dissipation during capture. Specifically, flip-flops which are not in the selected segment can receive the value of the previous flip-flop in the scan-chain. Alternatively, these flip-flops can recirculate their value.

Figure 6:
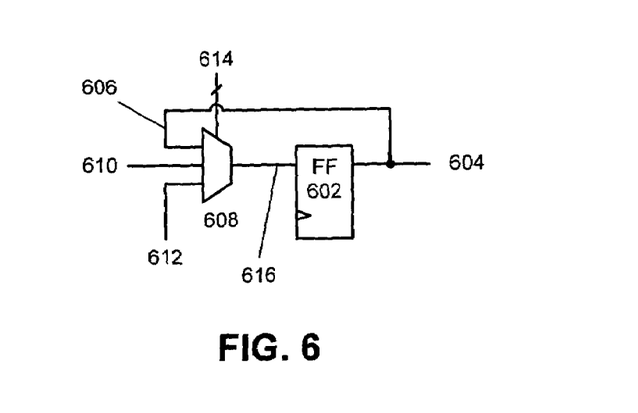
FIG. 6 illustrates how a flip-flop can recirculate its value in accordance with an embodiment of the present invention.

FIG. 6 illustrates how a flip-flop can recirculate its value in accordance with an embodiment of the present invention.

If a flip-flop, such as flip-flop 602, is not in the selected segment, it may be preferable that it not change state to prevent unnecessary power dissipation. One embodiment can recirculate the flip-flop's value to achieve this. For example, flip-flop 602's output 604 can be coupled with an input, such as input 606, of multiplexer 608. Other inputs of multiplexer 608, such as inputs 610 and 612, can be used to capture a CUT's output value and to shift values in the scan-chain, respectively. Multiplexer 608's control input 614 can be used to select which input is coupled with the output. For example, during capture, control input 614 can be used to couple flip-flop 602's output 604 with its own input 616, thereby reducing power dissipation by recirculating the flip-flop's value.

In one embodiment, the set of multiplexers are configured to ensure that only a limited number of flip-flops can change state during test, thereby guaranteeing that the power dissipation during test does not exceed the power budget.

The system can then capture the CUT's output values using the second set of flip-flops (step 210). In one embodiment, the second set of flip-flops can include all flip-flops that are used for test.

For example, CUT 404's output values can be captured using the second set of flip-flops 410. Recall that segment-selection circuit 412 can be used to configure the set of multiplexers 408 so that the outputs of the CUT 404 are coupled with the inputs 418 of the second set of flip-flops 410. Once the outputs of the CUT 404 are coupled with the inputs 418 of the second set of flip-flops 410, the second set of flip-flops 410 can be clocked to capture the output values.

Next, the system can scan-out the CUT's output values using the second set of flip-flops (step 212). In one embodiment, all the flip-flops in the circuit are used to scan out output values. This step is typically performed concurrently with a scan-in operation of the next pattern when multiple scan patterns are applied. While not shown as a specific step, the scan operation is usually preceded by a configuration step (like step 204) to configure all the flip-flops to receive data from the previous flip-flop in the scan chain.

For example, the system can scan-out CUT 404's output values using the second set of flip-flops 410. Note that the second set of flip-flops may be in different scan-chains. Hence, the system may have to scan-out multiple scan-chains to obtain the output values captured in the second set of flip-flops. Typically all active scan chains are shifted simultaneously.

The system can then determine whether the chip has a fault using the output values (step 214).

Capturing Outputs Using a Segment

Figure 7A:
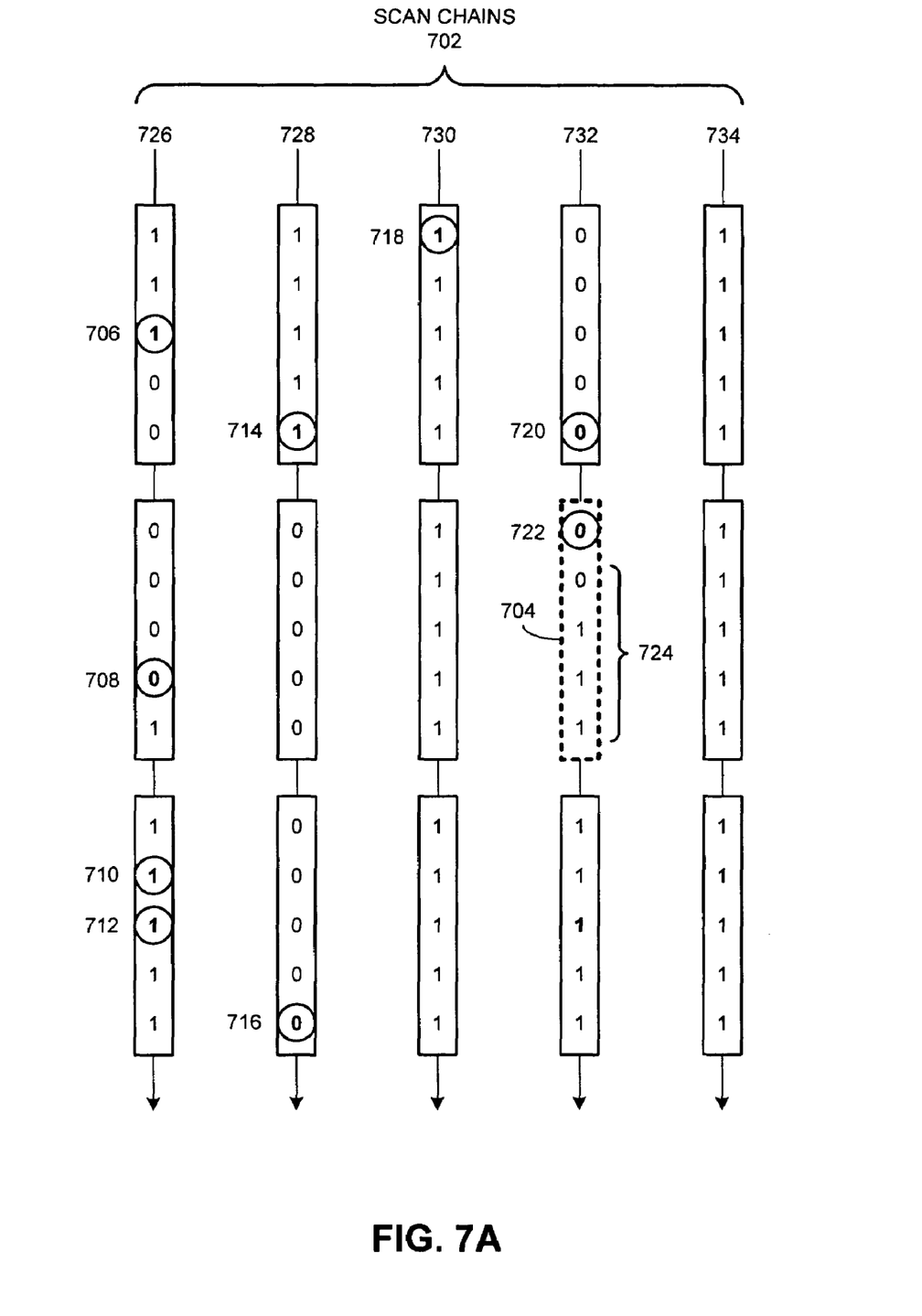
FIGS. 7A, 7B, and 7C illustrate how a segment can be used to capture outputs in accordance with an embodiment of the present invention.
Figure 7B:
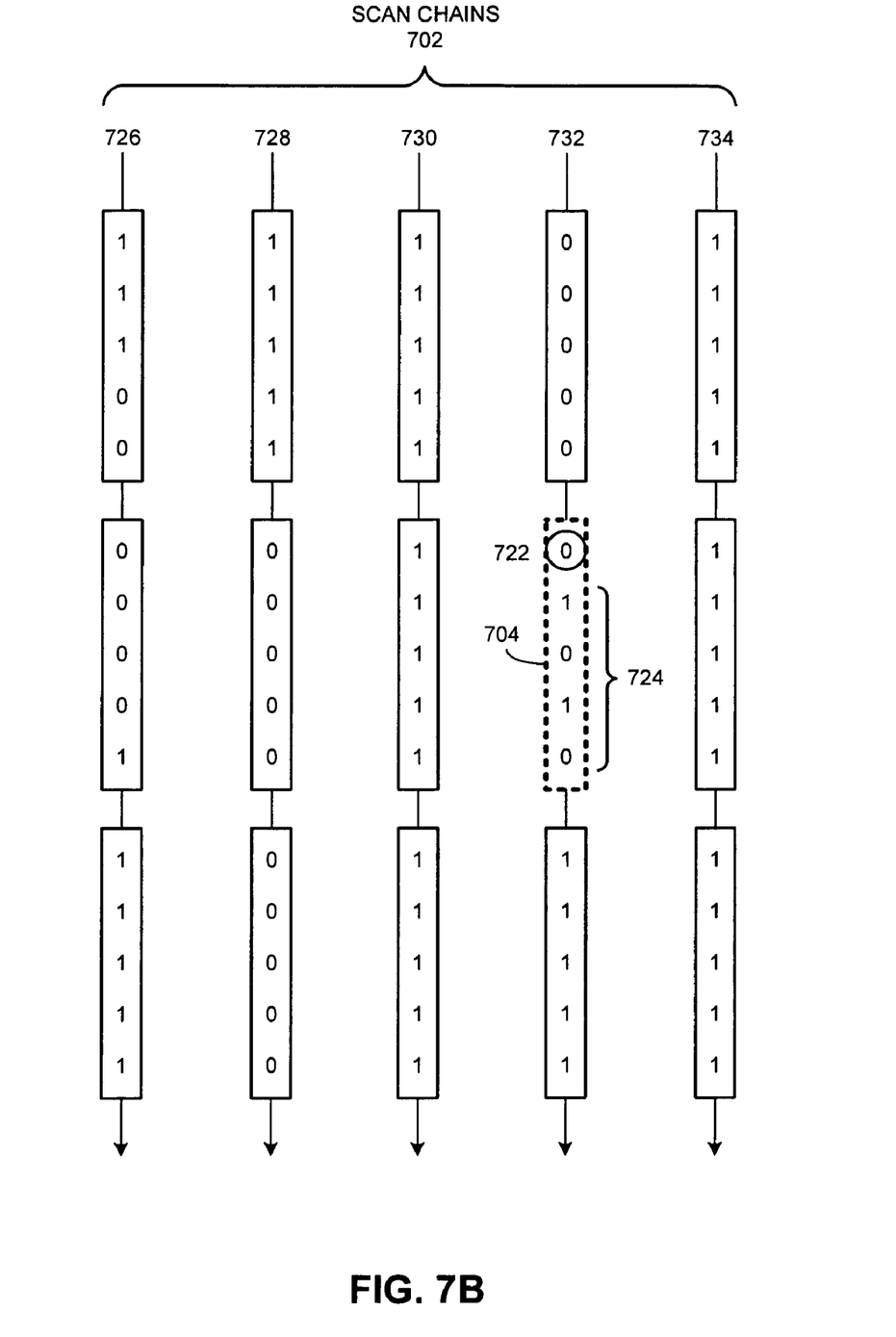
Figure 7C:
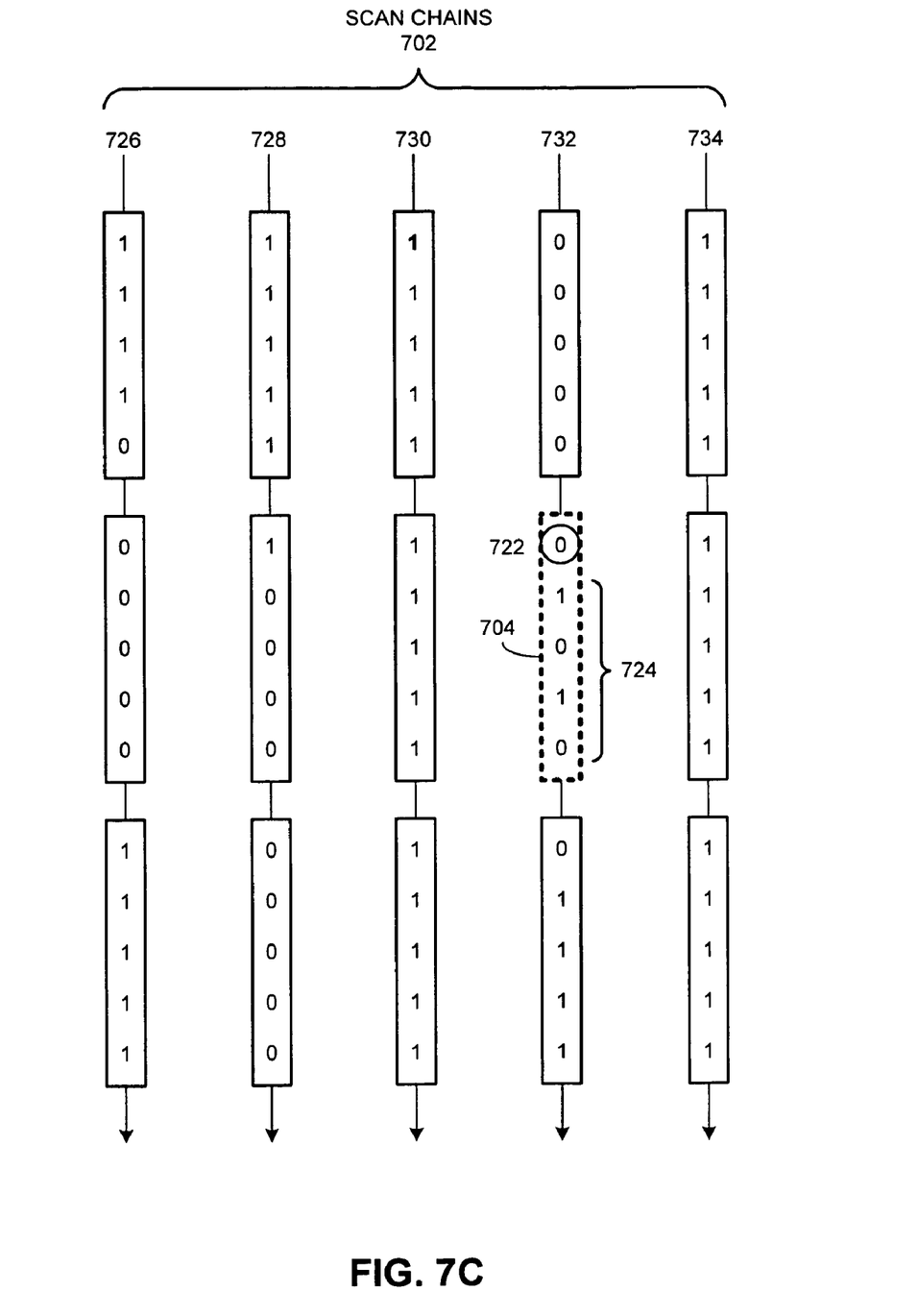

FIGS. 7A, 7B, and 7C illustrate how a segment can be used to capture outputs in accordance with an embodiment of the present invention.

The set of scan-chains 702 comprises scan-chains 726, 728, 730, 732, and 734. Each scan-chain comprises a number of flip-flops which are coupled in a serial fashion whose values have been shown in FIG. 7A. A segment, such as segment 704, comprises a set of flip-flops. Note that the segments (shown using rectangular boxes) in FIG. 7A are composed of contiguous flip-flops which belong to a single scan-chain. However, in general, a segment can comprise any arbitrary set of flip-flops, e.g., they can be non-contiguous and/or from different scan-chains.

A segment can be of any size. At one extreme, a segment can comprise only one flip-flop, whereas at the other extreme, a segment can comprise all the flip-flops. Typically, the segment size will lie somewhere between these two extremes. The size of a segment can relate to the complexity of the segment-selection circuit. Specifically, the smaller the segment size, the more complex the segment-selection circuit. In FIGS. 7A, 7B, and 7C, the segment size is equal to 5, i.e., each segment comprises 5 flip-flops.

Some flip-flops in a scan-chain can be used for applying inputs to a CUT, whereas other flip-flops in the scan-chain can be used for capturing outputs of the CUT. Specifically, the flip-flops that are being used to apply inputs can be from any segment regardless of whether the segment is a selected segment or not. However, the flip-flops that are being used to capture the outputs must be in one of the selected segments, because otherwise the flip-flops will not capture the CUT's outputs.

Specifically, flip-flops 706, 708, 710, 712, 714, 716, 718, 720, and 722 can be used to apply inputs (shown using a circle) to a CUT. The other flip-flops in the scan-chains can be assigned arbitrary values during scan-in. However, to reduce power dissipation, a technique called adjacent-fill can be used to assign values to the flip-flops.

Let us consider how adjacent-fill can be used to determine values for the flip-flops in scan-chain 726. In FIG. 7A, the values are scanned in from the top of the page and they progress towards the bottom. Hence, the first value that is scanned into the scan-chain is "1," which is the value of the bottommost flip-flop shown in scan-chain 726. Note that since the bottommost flip-flop in scan-chain 726 is not being used for applying an input value, the system can choose its value arbitrarily. In FIG. 7A, the system chose the value "1" for the bottommost flip-flop, however, the system could have also chosen the value "0."

The system then uses adjacent-fill to assign the value "1" to all the flip-flops until it reaches flip-flop 708, which is assigned value "0," because flip-flop 708 will be used to apply a "0" input to the CUT. Next, using the adjacent-fill technique, the system assigns the value "0" to all the flip-flops until it reaches flip-flop 706 when it is again forced to assign a "1" value.

FIG. 7B illustrates one possible outcome after the CUT's outputs are captured using selected segment 704. Note that except for the flip-flops in the selected segment 704, none of the other flip-flops have changed state. Further, note that a flip-flop in the selected segment, such as flip-flop 722, can be used to apply an input. The remaining flip-flops in segment 704, namely flip-flops 724, can be used to capture outputs. In one embodiment, the system can use the circuit shown in FIG. 6 to ensure that the flip-flops that are not in the selected segment do not change state during capture.

FIG. 7C illustrates another possible outcome after the CUT's outputs are captured using selected segment 704. Note that except for the flip-flops in the selected segment 704, all other flip-flops have shifted their value by one position just as they would have during a scan-in or a scan-out operation. In one embodiment, the system can use either the circuit shown in FIG. 5 or FIG. 6 to ensure that only the flip-flops that are in the selected segment capture the CUT's outputs, and all other flip-flops shift their values, i.e., they behave as if a scan-in or a scan-out operation was being performed.

Note that in both FIGS. 7B and 7C, the number of flip-flops that change state during capture is substantially less than the number of flip-flops that typically would have changed state if the present invention had not been used.

Power Dissipation Guarantee

One embodiment of the present invention can guarantee that the power dissipation during test is within a given power budget. Note that there can be a tradeoff between the number of faults that are tested in a clock period, and the power dissipation. Testing multiple faults typically requires a more random sequence of bits to be scanned in which usually causes more transitions, which, in turn, causes more power dissipation.

Consider a case where, by performing power analysis the system determines that, during test, only 20 flip-flops can switch at any given time. The present invention can be used to ensure that only 20 flip flops will switch at any given time during test. In contrast, prior art techniques cannot provide such guarantees.

The present invention can guarantee that power dissipation will be within a given power budget because of the following reasons. First, an embodiment of the present invention can use an adjacent-fill technique to determine input values, thereby limiting the number of transitions during scan-in.

Second, during capture, an embodiment can use a segment-selection circuit to ensure that only the flip-flops in the selected segment change state. Note that in one embodiment, some of the flip-flops that are not in the selected segment may also change state during capture because they may shift values. However, the number of such transitions is usually small and can be factored in by ATPG.

Finally, since only the flip-flops in the selected-segment change state during capture, almost all other flip-flops retain the values that were assigned to them by the adjacent-fill technique during scan-in. Hence, the number of transitions during scan-out is also substantially reduced.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), or any device capable of storing data usable by a computer system.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A method for testing a circuit within a chip, the method comprising:

scanning-in input values into a first set of flip-flops, wherein the outputs of the first set of flip-flops are coupled with the inputs of a circuit under test, wherein the outputs of the circuit are coupled with the inputs of a set of multiplexers, and wherein the outputs of the set of multiplexers are coupled with the inputs of a second set of flip-flops;

configuring the set of multiplexers using a segment-selection circuit, which causes the outputs of the circuit to be coupled with the inputs of the second set of flip-flops; and capturing the circuit's output values using the second set of flip-flops.

2. The method of claim 1, further comprising:
   determining a power budget which specifies the number of flip-flops which are allowed to change state when the circuit's output values are captured; and
   determining the input values, the first set of flip-flops, and the second set of flip-flops using the power budget.
3. The method of claim 1, further comprising:
   scanning-out the circuit's output values using the second set of flip-flops; and
   determining whether the chip has a fault using the output values.
4. The method of claim 1,
   wherein the input values, the first set of flip-flops, and the second set of flip-flops are determined using automatic test pattern generation (ATPG); and
   wherein ATPG uses adjacent-fill to determine input values.
5. The method of claim 1,
   wherein scanning-in input values involves scanning-in input values into a scan-chain, which is a sequence of flip-flops, wherein the output of a flip-flop in the scan-chain is coupled with the input of the next flip-flop in the scan-chain;
   wherein the second set of flip-flops includes flip-flops that are in different scan-chains.
6. The method of claim 1,
   wherein changing a flip-flop's state causes power dissipation; and
   wherein the set of multiplexers are configured to ensure that only a limited number of flip-flops are allowed to change state during test, thereby guaranteeing that the power dissipation during test does not exceed a power budget.
7. A computer-readable storage medium storing instructions that when executed by a computer cause the computer to perform a method for testing a circuit within a chip, the method comprising:
   scanning-in input values into a first set of flip-flops, wherein the outputs of the first set of flip-flops are coupled with the inputs of a circuit under test, wherein the outputs of the circuit are coupled with the inputs of a set of multiplexers, and wherein the outputs of the set of multiplexers are coupled with the inputs of a second set of flip-flops;
   configuring the set of multiplexers using a segment-selection circuit, which causes the outputs of the circuit to be coupled with the inputs of the second set of flip-flops; and
   capturing the circuit's output values using the second set of flip-flops.
8. The computer-readable storage medium of claim 7, the method farther comprising:
   determining a power budget which specifies the number of flip-flops which are allowed to change state when the circuit's output values are captured; and
   determining the input values, the first set of flip-flops, and the second set of flip-flops using the power budget.
9. The computer-readable storage medium of claim 7, the method further comprising:
   scanning-out the circuit's output values using the second set of flip-flops; and
   determining whether the chip has a fault using the output values.
10. The computer-readable storage medium of claim 7,
    wherein the input values, the first set of flip-flops, and the second set of flip-flops are determined using automatic test pattern generation (ATPG); and
    wherein ATPG uses adjacent-fill to determine input values.
11. The computer-readable storage medium of claim 7,
    wherein scanning-in input values involves scanning-in input values into a scan-chain, which is a sequence of flip-flops, wherein the output of a flip-flop in the scan-chain is coupled with the input of the next flip-flop in the scan-chain;
    wherein the second set of flip-flops includes flip-flops that are in different scan-chains.
12. The computer-readable storage medium of claim 7,
    wherein changing a flip-flop's state causes power dissipation; and
    wherein the set of multiplexers are configured to ensure that only a limited number of flip-flops are allowed to change state during test, thereby guaranteeing that the power dissipation during test does not exceed a power budget.
13. An apparatus for testing a circuit, the apparatus comprising:
    a scanning-in mechanism configured to scan-in input values into a first set of flip-flops, wherein the outputs of the first set of flip-flops are coupled with the inputs of a circuit under test, wherein the outputs of the circuit are coupled with the inputs of a set of multiplexers, and wherein the outputs of the set of multiplexers are coupled with the inputs of a second set of flip-flops;
    a segment-selection circuit to configure the set of multiplexers so that the outputs of the circuit are coupled with the inputs of the second set of flip-flops; and
    a capturing mechanism configured to capture the circuit's output values using the second set of flip-flops.
14. The apparatus of claim 13, further comprising:
    a first determining mechanism configured to determine a power budget which specifies the number of flip-flops which are allowed to change state when the circuit's output values are captured; and
    a second determining mechanism configured to determine the input values, the first set of flip-flops, and the second set of flip-flops using the power budget.
15. The apparatus of claim 13, further comprising:
    a scanning-out mechanism configured to scan-out the circuit's output values using the second set of flip-flops; and
    a determining mechanism configured to determine whether the chip has a fault using the output values.
16. The apparatus of claim 13,
    wherein the input values, the first set of flip-flops, and the second set of flip-flops are determined using automatic test pattern generation (ATPG); and
    wherein ATPG uses adjacent-fill to determine input values.
17. The apparatus of claim 13,
    wherein the scanning-in mechanism is configured to scan-in input values into a scan-chain, which is a sequence of flip-flops, wherein the output of a flip-flop in the scan-chain is coupled with the input of the next flip-flop in the scan-chain;
    wherein the second set of flip-flops includes flip-flops that are in different scan-chains.
18. The apparatus of claim 13,
    wherein changing a flip-flop's state causes power dissipation; and
    wherein the set of multiplexers are configured to ensure that only a limited number of flip-flops are allowed to change state during test, thereby guaranteeing that the power dissipation during test does not exceed a power budget.
19. A first circuit for testing a second circuit, the first circuit comprising:

a first set of flip-flops, wherein the outputs of the first set of flip-flops are coupled with the inputs of a second circuit under test;

a set of multiplexers, wherein the outputs of the second circuit are coupled with the inputs of the set of multiplexers;

a second set of flip-flops, wherein the outputs of the set of multiplexers are coupled with the inputs of the second set of flip-flops; and a segment-selection circuit, wherein the outputs of the segment-selection circuit are coupled with the control inputs of the set of multiplexers;

wherein the segment-selection circuit is used to couple an output of the second circuit with an input of a flip-flop in the second set of flip-flops;

wherein the segment-selection circuit is used to guarantee that the power dissipation does not exceed a power budget.

20. The first circuit of claim 19, further comprising:

a scanning-in mechanism configured to scan-in input values into the first set of flip-flops;

a capturing mechanism configured to capture the second circuit's output values using the second set of flip-flops; and a scanning-out mechanism configured to scan-out the second circuit's output values using the second set of flip-flops.

* * * * *

UNITED STATES PATENT AND TRADEMARK OFFICE
CERTIFICATE OF CORRECTION

PATENT NO. : 7,669,098 B2  Page 1 of 1
APPLICATION NO. : 11/635155
DATED : February 23, 2010
INVENTOR(S) : Rohit Kapur et al.

It is certified that error appears in the above-identified patent and that said Letters Patent is hereby corrected as shown below:

In claim 8 (at column 11, line 51), please replace the word "farther" with the word --further--.

Signed and Sealed this

Twenty-seventh Day of April, 2010

David J. Kappos
*Director of the United States Patent and Trademark Office*

UNITED STATES PATENT AND TRADEMARK OFFICE
CERTIFICATE OF CORRECTION

PATENT NO. : 7,669,098 B2  Page 1 of 1
APPLICATION NO. : 11/635155
DATED : February 23, 2010
INVENTOR(S) : Kapur et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 575 days.

Signed and Sealed this

Seventh Day of December, 2010

David J. Kappos
*Director of the United States Patent and Trademark Office*